United States Patent
Anderson et al.

(10) Patent No.: US 11,538,939 B2
(45) Date of Patent: Dec. 27, 2022

(54) CONTROLLED BOTTOM JUNCTIONS

(71) Applicant: INTERNATIONAL BUSINESS MACHINES CORPORATION, Armonk, NY (US)

(72) Inventors: Brent Anderson, Jericho, VT (US); Ruilong Xie, Niskayuna, NY (US); Juntao Li, Cohoes, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/742,528

(22) Filed: Jan. 14, 2020

(65) Prior Publication Data
US 2021/0217896 A1 Jul. 15, 2021

(51) Int. Cl.
*H01L 29/786* (2006.01)
*H01L 29/66* (2006.01)

(52) U.S. Cl.
CPC .... *H01L 29/78642* (2013.01); *H01L 29/6656* (2013.01); *H01L 29/66787* (2013.01)

(58) Field of Classification Search
CPC ................................................. H01L 29/78642
See application file for complete search history.

(56) References Cited

U.S. PATENT DOCUMENTS

| | | | |
|---|---|---|---|
| 9,437,503 B1 | 9/2016 | Mallela et al. | |
| 9,530,863 B1 | 12/2016 | Zhang et al. | |
| 9,530,866 B1 | 12/2016 | Zhang et al. | |
| 9,570,357 B2 | 2/2017 | Anderson et al. | |
| 9,627,511 B1 | 4/2017 | Cheng et al. | |
| 9,647,120 B1* | 5/2017 | Bi | H01L 23/535 |
| 9,716,170 B1 | 7/2017 | Cheng et al. | |
| 9,741,626 B1 | 8/2017 | Cheng et al. | |
| 9,780,208 B1 | 10/2017 | Xie et al. | |
| 9,799,749 B1 | 10/2017 | Bi et al. | |
| 10,008,417 B1* | 6/2018 | Bao | H01L 27/088 |
| 10,096,692 B1 | 10/2018 | Cheng et al. | |
| 10,263,122 B1 | 4/2019 | Zang et al. | |
| 2007/0082448 A1* | 4/2007 | Kim | H01L 27/10885 438/268 |
| 2017/0358497 A1 | 12/2017 | Cheng et al. | |
| 2018/0047828 A1* | 2/2018 | Gluschenkov | H01L 21/31111 |
| 2018/0226489 A1* | 8/2018 | Bi | H01L 29/7827 |

(Continued)

*Primary Examiner* — Moin M Rahman
*Assistant Examiner* — Mohammad A Rahman
(74) *Attorney, Agent, or Firm* — Tutunjian & Bitetto, P.C.; Samuel Waldbaum (57) ABSTRACT

A method of forming a vertical transport field effect transistor (VTFET) is provided. The method includes forming one or more vertical fins on a substrate, wherein there is a fin transition region between each of the one or more vertical fins and the substrate. The method further includes forming a sidewall liner having a first thickness on each of the one or more vertical fins. The method further includes forming a sidewall spacer having a second thickness on each of the sidewall liner(s), wherein the first thickness of the sidewall liner and the second thickness of the sidewall spacer determines an offset distance from each of the one or more vertical fins. The method further includes forming a trench with an edge offset from each of the one or more vertical fins by the offset distance.

12 Claims, 10 Drawing Sheets

(56) References Cited

U.S. PATENT DOCUMENTS

2019/0051563 A1    2/2019  Park et al.
2019/0097016 A1    3/2019  Alptekin et al.
2019/0393341 A1*  12/2019  Mochizuki .............. H01L 21/56

* cited by examiner

CONTROLLED BOTTOM JUNCTIONS

BACKGROUND

The present invention generally relates to bottom junctions of field effect transistors (FETs), and more particularly to bottom spacer formation to control the bottom junction of vertical transport field effect transistors (VTFETs).

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a method of forming a vertical transport field effect transistor (VTFET) is provided. The method includes forming one or more vertical fins on a substrate, wherein there is a fin transition region between each of the one or more vertical fins and the substrate. The method further includes forming a sidewall liner having a first thickness on each of the one or more vertical fins. The method further includes forming a sidewall spacer having a second thickness on each of the sidewall liner(s), wherein the first thickness of the sidewall liner and the second thickness of the sidewall spacer determines an offset distance from each of the one or more vertical fins. The method further includes forming a trench with an edge offset from each of the one or more vertical fins by the offset distance.

In accordance with another embodiment of the present invention, a vertical transport field effect transistor (VTFET) is provided. The VTFET includes a vertical fin on a substrate, wherein there is a fin transition region between the vertical fin and the substrate. The VTFET further includes a gap layer segment on the substrate, wherein an edge of the gap layer segment is separated from the fin transition region by a spacer gap. The VTFET further includes a bottom spacer layer on the gap layer segment, wherein the spacer gap is between the bottom spacer layer and the vertical fin. The VTFET further includes a gate dielectric layer on the bottom spacer layer, gap layer segment, and fin transition region. The VTFET further includes a conductive gate layer in the spacer gap between the gap layer segment and vertical fin.

In accordance with yet another embodiment of the present invention, a vertical transport field effect transistor (VTFET) is provided. The VTFET includes a vertical fin on a substrate, wherein there is a fin transition region between the vertical fin and the substrate. The VTFET further includes a gap layer segment on the substrate adjacent to the fin transition region. The VTFET further includes a bottom spacer layer on the gap layer segment, wherein there is a spacer gap between the bottom spacer layer and the vertical fin, and a gate structure in the spacer gap.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a vertical transport field effect transistor device (VTFET) with controlled positioning of the gate structure junction with increased uniformity in the bottom spacer dimensions and placement relative to the vertical fin.

Embodiments of the present invention provide a vertical transport field effect transistor device (VTFET) with reduced parasitic capacitance between the gate structure and bottom source/drain.

Exemplary applications/uses to which the present invention can be applied include, but are not limited to: logic devices (e.g., NAND gates, NOR gates, XOR, gates), memory devices (e.g., static random access memory (SRAM), dynamic random access memory (DRAM)), application specific integrated circuits (ASICs), and analog devices.

It is to be understood that aspects of the present invention will be described in terms of a given illustrative architecture; however, other architectures, structures, substrate materials and process features and steps can be varied within the scope of aspects of the present invention.

Figure 1:
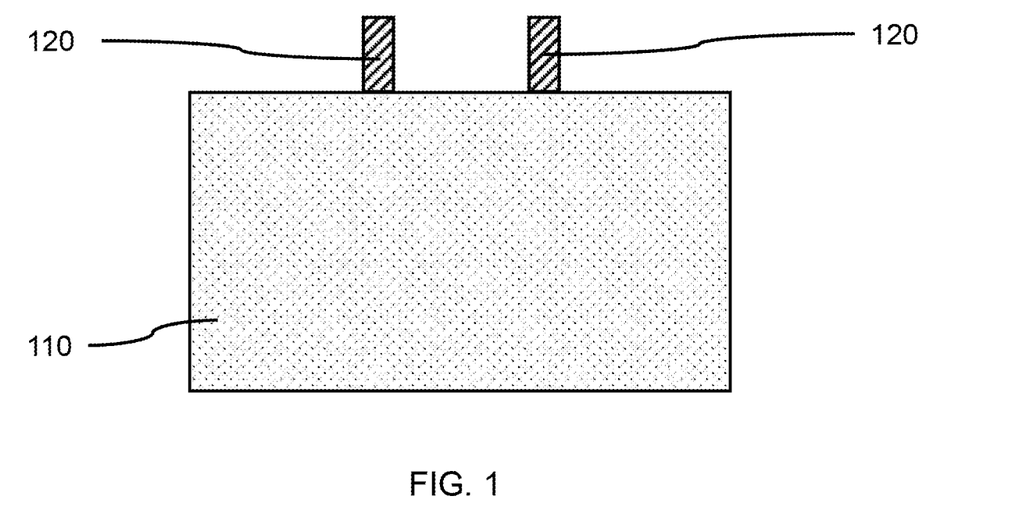
FIG. 1 is a cross-sectional side view showing fin templates on a substrate, in accordance with an embodiment of the present invention.

Referring now to the drawings in which like numerals represent the same or similar elements and initially to FIG. 1, a cross-sectional side view of fin templates on a substrate is shown, in accordance with an embodiment of the present invention.

In one or more embodiments, a plurality of fin templates 120 can be formed on a substrate 110, where the fin templates 120 can be a hardmask material (e.g., silicon nitride (SiN), silicon oxide (SiO)) patterned using lithographic techniques and etching or by sidewall image transfer processes, for example, self-aligned double patterning (SADP) and/or self-aligned quadruple patterning (SAQP).

In various embodiments, the substrate 110 can be a semiconductor substrate or a semiconductor-on-insulator (SOI). The semiconductor substrate can be a group IV semiconductor (e.g., silicon (Si), germanium (Ge)), a group IV compound semiconductor (e.g., silicon-germanium (SiGe), silicon carbide (SiC)), a group III-V compound semiconductor (e.g., gallium arsenide (GaAs), gallium nitride (GaN), indium, phosphide (InP)), and combinations thereof. The semiconductor-on-insulator (SOI) substrate can have a semiconductor active layer for forming devices on an electrically insulating layer and carrier layer.

Figure 2:
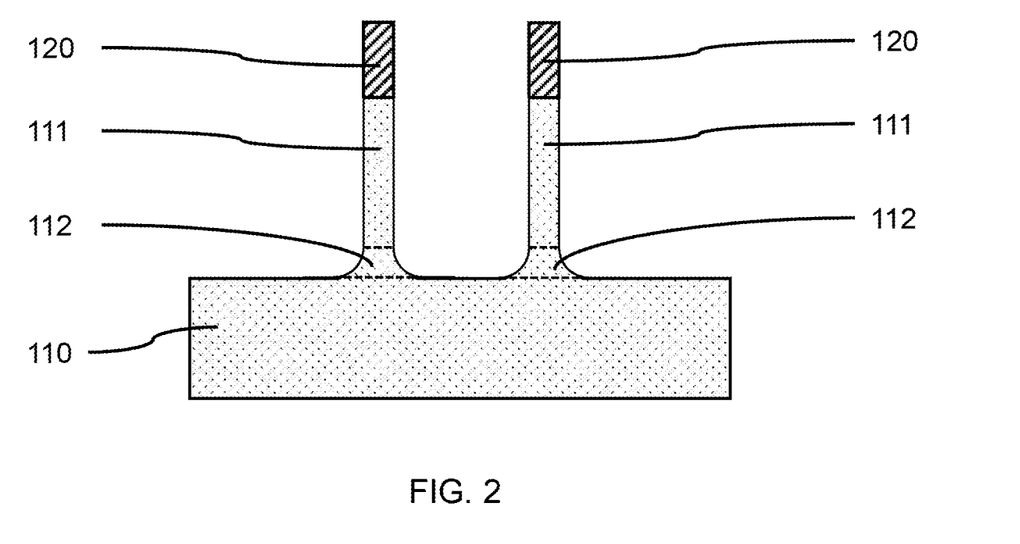
FIG. 2 is a cross-sectional side view showing the fin templates on fins formed from the substrate, in accordance with an embodiment of the present invention.

FIG. 2 is a cross-sectional side view showing the fin templates on fins formed from the substrate, in accordance with an embodiment of the present invention.

In one or more embodiments, the pattern of fin templates 120 can be transferred to the substrate 110 using a selective, directional etch, for example, a reactive ion etch (RIE) to form vertical fins 111. The vertical fins 111 can have a fin transition region 112 formed by etching, where the fin transition region 112 can be the portion of the vertical fins 111 between a point where a reference slope is essentially parallel with the slope of the vertical fin sidewall and a point where the reference slope is essentially parallel with the plane of the substrate 110. The sidewalls of the fin transition region 112 can be curved.

Figure 3:
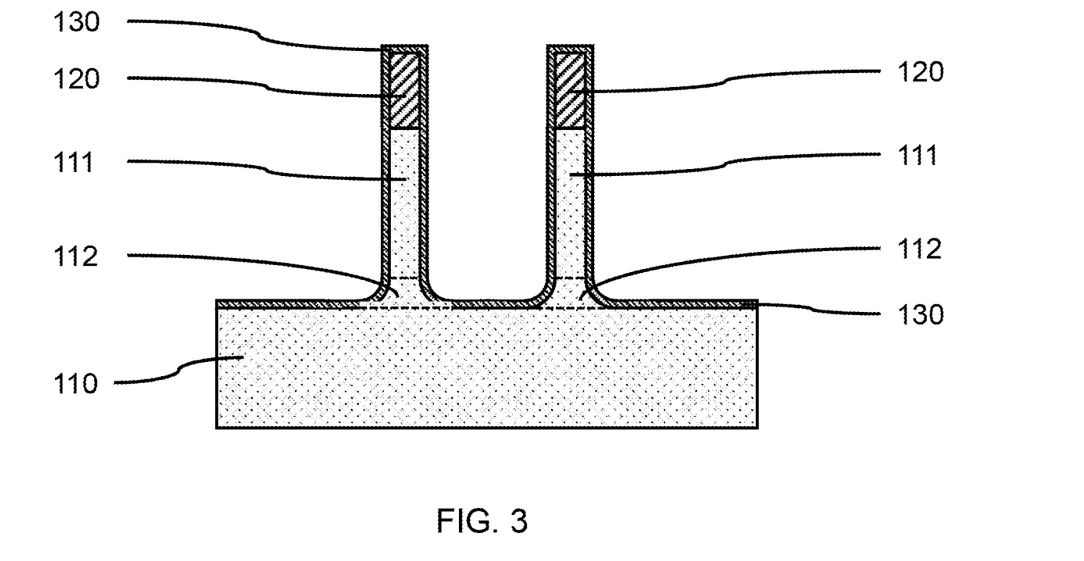
FIG. 3 is a cross-sectional side view showing a liner layer formed on the fin templates, vertical fins, and substrate, in accordance with an embodiment of the present invention.

FIG. 3 is a cross-sectional side view showing a liner layer formed on the fin templates, vertical fins, and substrate, in accordance with an embodiment of the present invention.

In one or more embodiments, a liner layer 130 can be formed on the fin templates 120, vertical fins 111, fin transition region 112, and surface of the substrate 110. The liner layer 130 can be formed by a conformal deposition, for example, atomic layer deposition (ALD), plasma enhanced ALD (PEALD), or a combination thereof.

In various embodiments, the liner layer 130 can have a thickness in a range of about 1 nanometers (nm) to about 5 nm, or about 2 nm to about 4 nm, although other thicknesses are also contemplated. The thickness of the liner layer 130 can have a tight tolerance using the conformal deposition to control an offset distance from the sidewalls of the vertical fin 111. The liner layer 130 can sufficiently thick to protect the vertical fins 111 and fin transition regions 112 during subsequent processing.

In various embodiment, the liner layer 130 can be a dielectric material, including, but not limited to, titanium oxide (TiO), silicon nitride (SiN), silicon oxide (SiO), and combinations thereof, where the liner layer 130 can be selectively removed relative to other layers and materials present.

Figure 4:
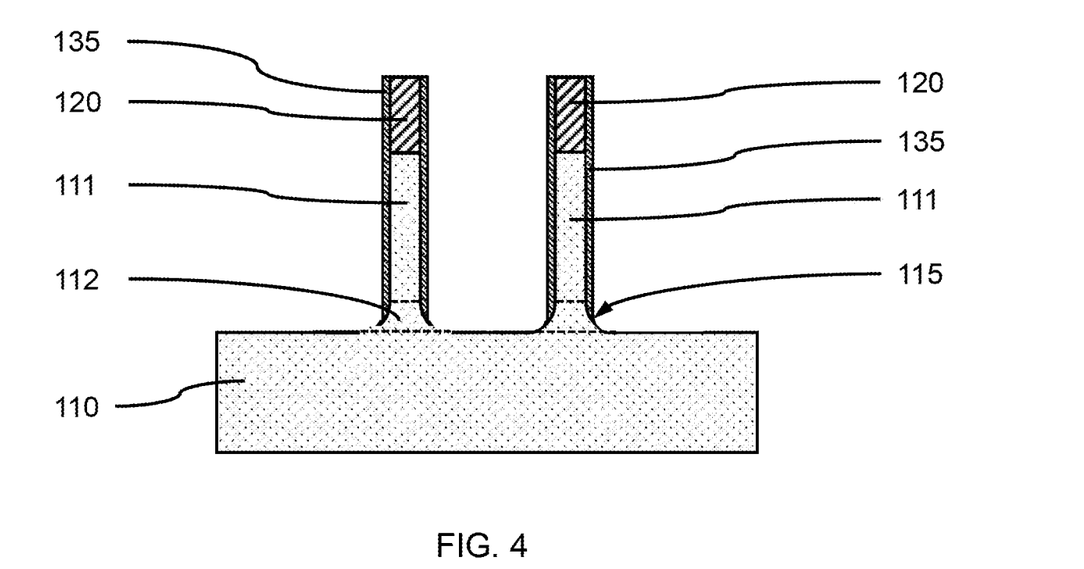
FIG. 4 is a cross-sectional side view showing portions of the liner layer removed from the substrate to form sidewall liners on the fin templates and vertical fins, in accordance with an embodiment of the present invention.

FIG. 4 is a cross-sectional side view showing portions of the liner layer removed from the substrate to form sidewall liners on the fin templates and vertical fins, in accordance with an embodiment of the present invention.

In one or more embodiments, portions of the liner layer 130 on the surfaces of the substrate 110 and fin templates 120 parallel with the plane of the substrate can be removed with a selective directional etch (e.g., RIE), while leaving sidewall liners 135 on the sidewalls of the fin templates 120, vertical fins 111, and possibly upper portions of the fin transition regions 112. The portion of the liner layer 130 on the fin transition regions 112 can be removed to expose the fin transition regions 112 due to the thinness of the liner layer 130. The bottom edge of the sidewall liners 135 can have a distinct end that accurately define a position 115 where the sidewall liner 135 ends and the surface of the fin transition region 112 becomes exposed.

Figure 5:
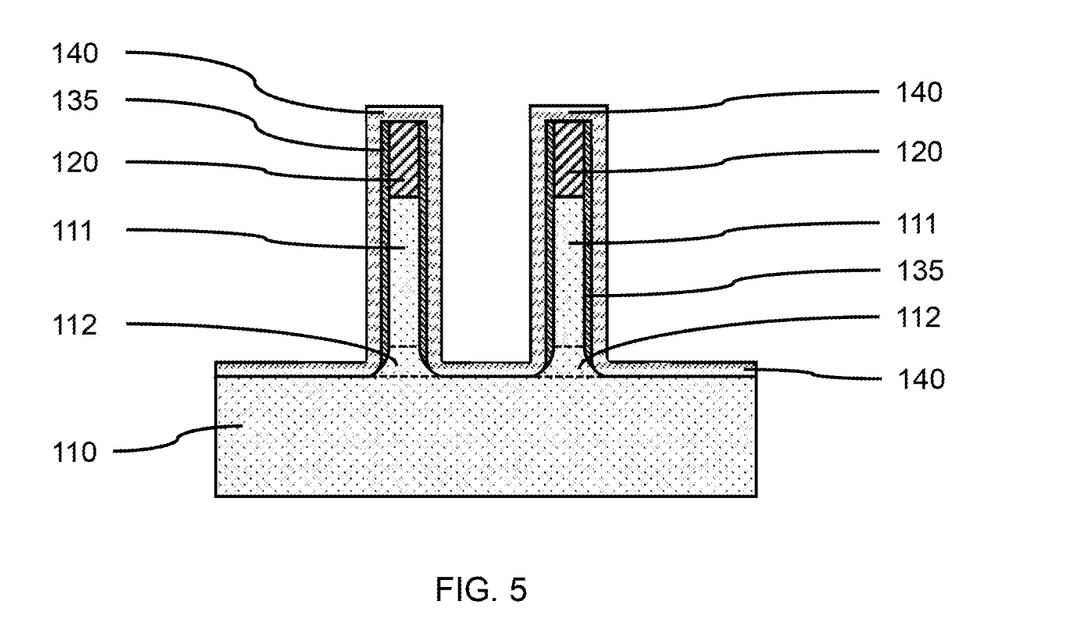
FIG. 5 is a cross-sectional side view showing a spacer layer formed on the sidewall liners and fin templates, in accordance with an embodiment of the present invention.

FIG. 5 is a cross-sectional side view showing a spacer layer formed on the sidewall liners and fin templates, in accordance with an embodiment of the present invention.

In one or more embodiments, a spacer layer 140 can be formed on the exposed surfaces of the substrate 110, fin transition regions 112, sidewall liners 135, and fin templates 120. The spacer layer 140 can be formed by a conformal deposition (e.g., ALD, PEALD, combinations thereof) that provides a precise control over the thickness and uniformity of the spacer layer 140.

In various embodiments, a spacer layer 140 can have a thickness in a range of about 0.5 nanometers (nm) to about 8 nm, or about 2 nm to about 4 nm, although other thicknesses are also contemplated.

In various embodiment, the spacer layer 140 can be a dielectric material, including, but not limited to, silicon nitride (SiN), silicon boro carbonitride (SiBCN), silicon oxide (SiO), and combinations thereof, where the spacer layer 140 can be selectively removed relative to other layers and materials present.

Figure 6:
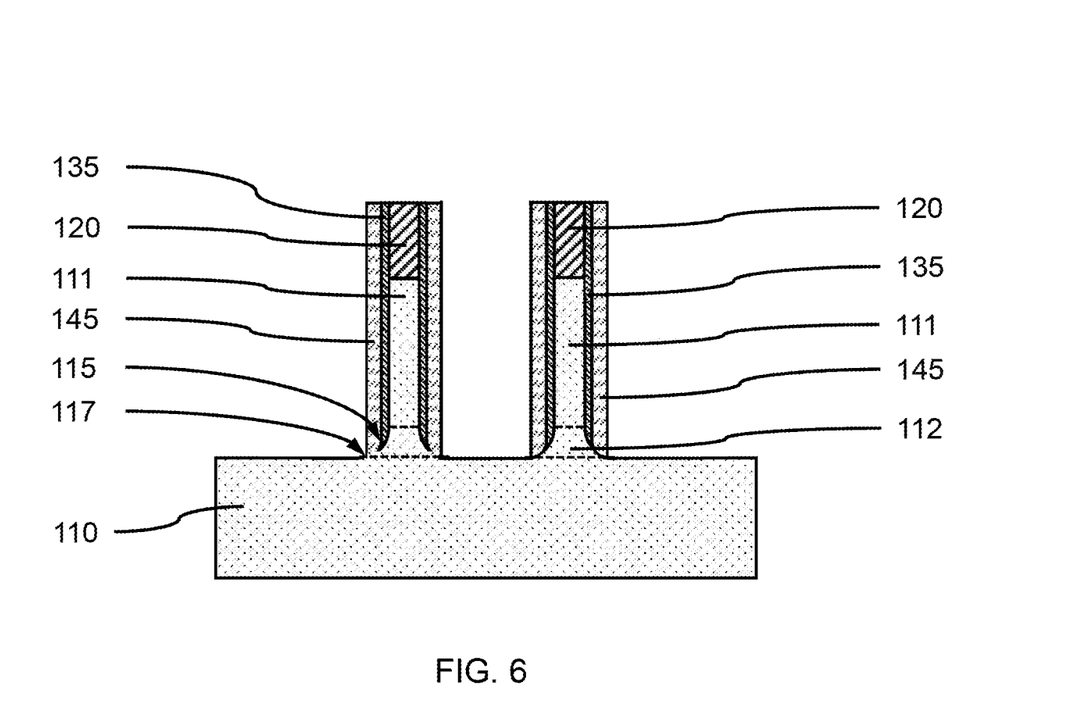
FIG. 6 is a cross-sectional side view showing portions of the spacer layer removed from regions of the substrate to form sidewall spacers on the sidewall liners and fin transition regions, in accordance with an embodiment of the present invention.

FIG. 6 is a cross-sectional side view showing portions of the spacer layer removed from regions of the substrate to form sidewall spacers on the sidewall liners and fin transition regions, in accordance with an embodiment of the present invention.

In one or more embodiments, portions of the spacer layer 140 on the surfaces of the substrate 110 and fin templates 120 parallel with the plane of the substrate 110 can be removed with a selective directional etch (e.g., RIE), while leaving sidewall spacers 145 on the sidewall liners 135 and at least a portion of the fin transition region 112. The portion of the liner layer 130 on the fin transition regions 112 can be determined by the thickness of the spacer layer 140 and the curvature of the fin transition regions 112. The bottom edge of the sidewall spacers 145 can have a distinct end that accurately define a position 117 where the sidewall spacer 145 ends and the surface of the fin transition region 112 or substrate 110 becomes exposed. The position 117 can be laterally offset from position 115 by the thickness of the spacer layer 140, where the thickness of the spacer layer 140 and liner layer 130 determine an offset distance from the sidewalls of the vertical fin 111.

Figure 7:
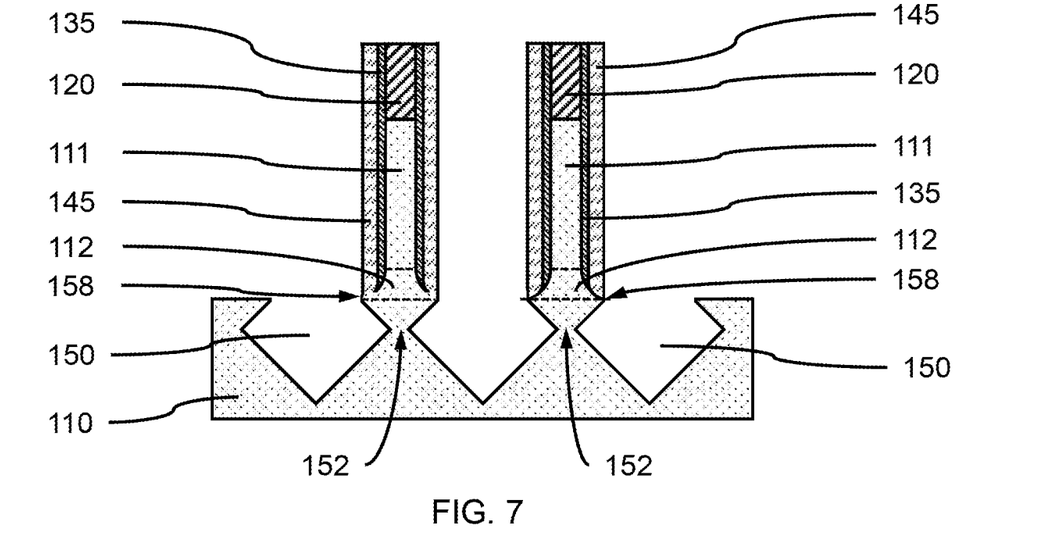
FIG. 7 is a cross-sectional side view showing trenches formed in the substrate adjacent to the sidewall spacers and vertical fins, in accordance with an embodiment of the present invention.

FIG. 7 is a cross-sectional side view showing trenches formed in the substrate adjacent to the sidewall spacers and vertical fins, in accordance with an embodiment of the present invention.

In one or more embodiments, trenches 150 can be formed in the substrate 110 adjacent to the vertical fins 111, where the trenches 150 can be formed by a wet or dry etch. The trenches 150 can be facetted trenches that form a narrow neck 152 in the substrate 110 below the fin transition region 112 and vertical fins 111. In various embodiments, The width of the narrow neck 152 can be less than the width of the overlying vertical fin 111. The sidewall spacers 145 can mask a portion of the substrate 110 and/or fin transition region 112 adjacent to the vertical fins 111 to determine the position of subsequently formed bottom source/drains from a gate junction and vertical fins 111, where the edge 158 of the trench can define a precise position from the adjacent vertical fin 111.

Figure 8:
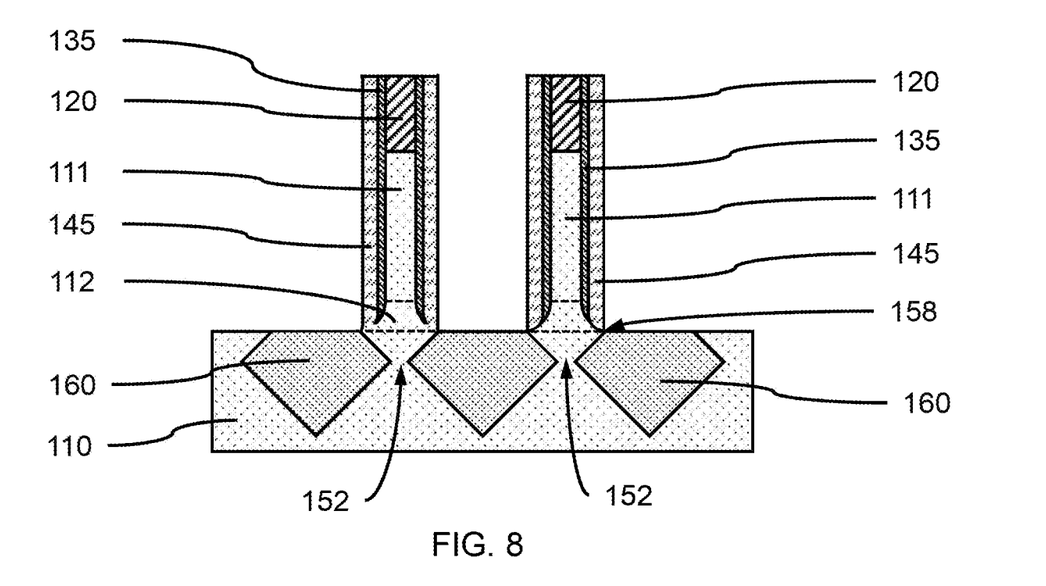
FIG. 8 is a cross-sectional side view showing bottom source/drains formed in the trenches adjacent to the sidewall spacers and vertical fins, in accordance with an embodiment of the present invention.

FIG. 8 is a cross-sectional side view showing bottom source/drains formed in the trenches adjacent to the sidewall spacers and vertical fins, in accordance with an embodiment of the present invention.

In one or more embodiments, a bottom source/drain 160 can be formed in each of the trenches 150, where the bottom source/drains 160 can be formed by epitaxial growth from the exposed sidewalls of the trenches 150. In various embodiments, the bottom source/drains 160 can be a semiconductor material that is n-doped or p-doped. An n-doped bottom source/drain 150 can be silicon (Si) with an n-type dopant, and a p-doped bottom source/drain can be silicon-germanium (SiGe) with a p-type dopant. A top surface of a bottom source/drain 160 can have a bottom source/drain edge formed at the edge 158 of the trench. A separate bottom source/drain 160 can be on each of opposite sides of a vertical fin 111. In various embodiments, the bottom source/drain edge can be offset a distance in a range of about 0 nm to about 5 nm from the vertical fin 111.

In various embodiments, a narrow neck 152 can be formed in the substrate 110 below the fin transition region 112, where the narrow neck 152 can be the closest approach between two bottom source/drains 160 below the same vertical fin 111.

Figure 9:
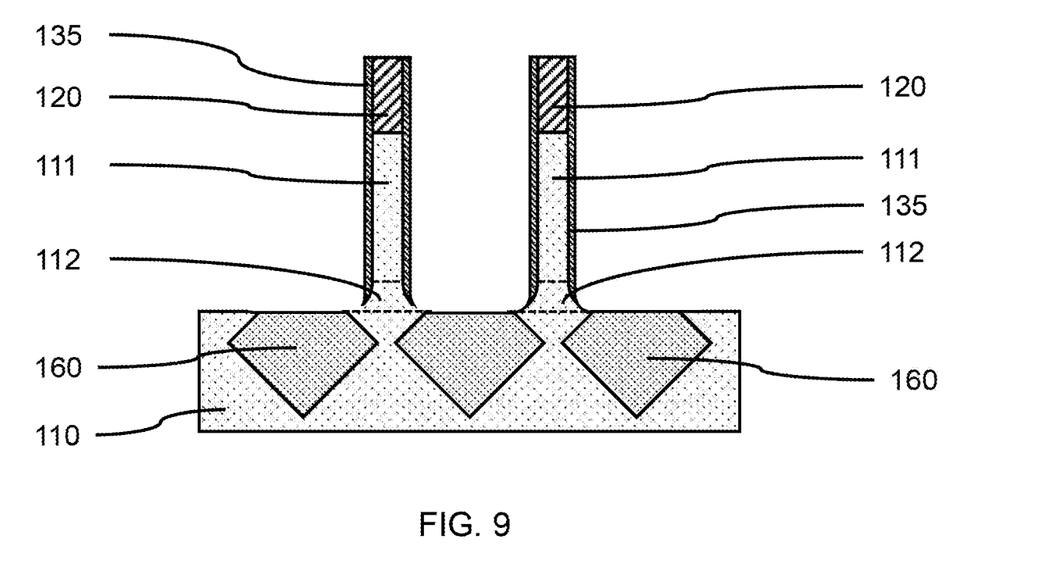
FIG. 9 is a cross-sectional side view showing the sidewall spacers removed from the sidewall liners and fin transition regions, in accordance with an embodiment of the present invention.

FIG. 9 is a cross-sectional side view showing the sidewall spacers removed from the sidewall liners and fin transition regions, in accordance with an embodiment of the present invention.

In one or more embodiments, the sidewall spacers 145 can be removed from the sidewall liners 135 and fin transition regions 112, where the sidewall spacers 145 can be removed using a selective isotropic etch, for example, a dry plasma etch or wet chemical etch. Removal of the sidewall spacers 145 can expose a portion of the fin transition regions 112 having a curved surface between the substrate surface and/or bottom source/drains 160 and the vertical fins 111. Removal of the sidewall spacers 145 can expose the sidewall liners 135.

Figure 10:
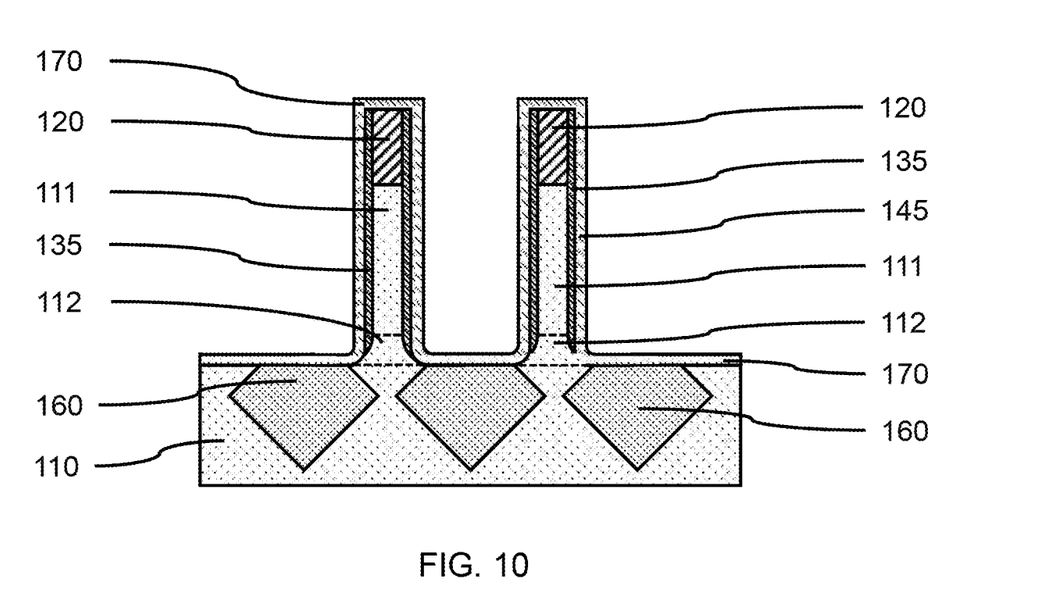
FIG. 10 is a cross-sectional side view showing a gap layer formed on the sidewall liners and fin templates, in accordance with an embodiment of the present invention.

FIG. 10 is a cross-sectional side view showing a gap layer formed on the sidewall liners and fin templates, in accordance with an embodiment of the present invention.

In one or more embodiments, a gap layer 170 can be formed on the exposed surfaces of the sidewall liners 135, fin templates 120, bottom source/drains 160, fin transition regions 112, and substrate 110. The gap layer 170 can be formed by a conformal deposition (e.g., ALD, PEALD, combinations thereof), that has a precise control of the thickness.

In various embodiments, a gap layer 170 can have a thickness in a range of about 0.5 nm to about 10 nm, or about 1 nm to about 3 nm, although other thicknesses are also contemplated.

In various embodiment, the gap layer 170 can be a dielectric material, including, but not limited to, silicon nitride (SiN), silicon boro carbonitride (SiBCN), silicon oxide (SiO), and combinations thereof, where the gap layer 170 can be selectively removed relative to other layers and materials present.

Figure 11:
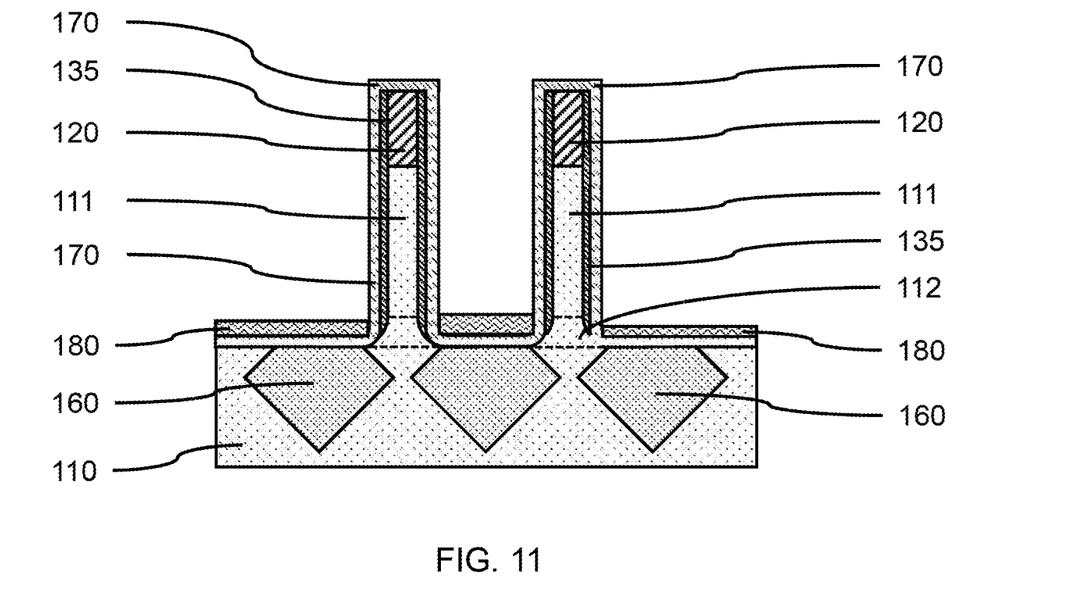
FIG. 11 is a cross-sectional side view showing a bottom spacer layer formed on the gap layer over the substrate and bottom source/drains, in accordance with an embodiment of the present invention.

FIG. 11 is a cross-sectional side view showing a bottom spacer layer formed on the gap layer over the substrate and bottom source/drains, in accordance with an embodiment of the present invention.

In one or more embodiments, a bottom spacer layer 180 can be formed on the gap layer 170 over the substrate 110 and bottom source/drains 160. The bottom spacer layer 180 can be formed by a directional deposition, for example, a high density plasma (HDP) deposition, a gas cluster ion beam (GCIB) deposition, or a combination thereof. An etch-back using a selective directional etch (e.g., RIE) can be used to reduce the height of the bottom spacer layer 180.

In various embodiments, the bottom spacer layer 180 can have a thickness in a range of about 2 nm to about 10 nm with a variation in the thickness at different points of about 1 nm to about 5 nm. The thickness of the bottom spacer layer 180 can be different between different adjacent pairs of the vertical fins 111 due to processing. The top surface of the bottom spacer layer 180 on a gap layer segment 175 on a first VTFET device can be at a different height than the bottom spacer layer 180 on a gap layer segment 175 on a second VTFET device. The differences between bottom spacer layer thicknesses can introduce unwanted device variations and nonuniform gate junction positions.

In various embodiment, the bottom spacer layer 180 can be a dielectric material, including, but not limited to, silicon oxide (SiO), silicon nitride (SiN), silicon boro carbonitride (SiBCN), and combinations thereof, where the bottom spacer layer 180 can be selectively removed relative to other layers and materials present.

Figure 12:
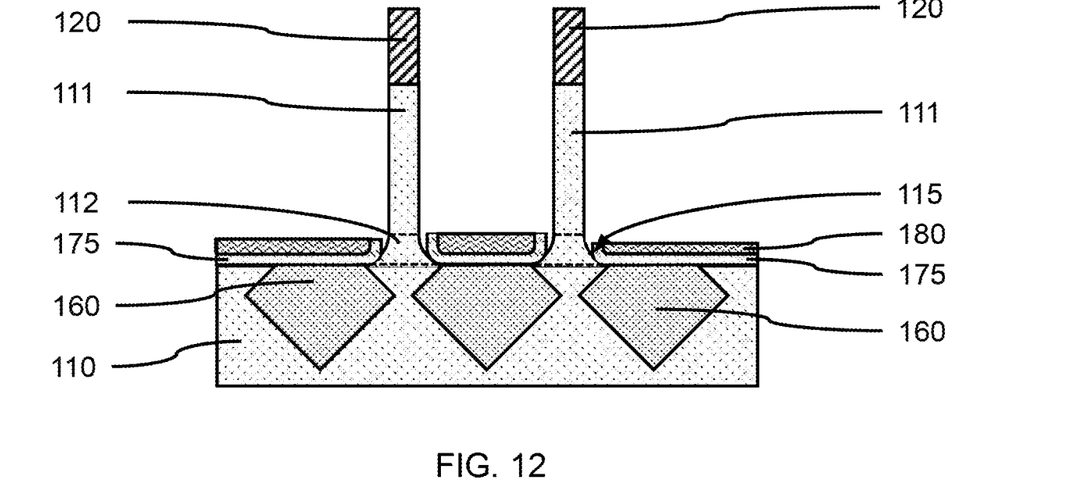
FIG. 12 is a cross-sectional side view showing exposed portions of the gap layer removed from the sidewall liners, and the sidewall liners removed to expose the vertical fins, in accordance with an embodiment of the present invention.

FIG. 12 is a cross-sectional side view showing exposed portions of the gap layer removed from the sidewall liners, and the sidewall liners removed to expose the vertical fins, in accordance with an embodiment of the present invention.

In one or more embodiments, exposed portions of the gap layer 170 can be removed from the sidewall liners 135 using a selective isotropic etch (e.g., dry plasma etch). The bottom spacer layer 180 can mask portions of the gap layer 170, such that the gap layer 170 can be removed down to the top surface of the bottom spacer layer 180. Removal of the portions of the gap layer 170 can expose the underlying sidewall liners 135, and form gap layer segments 175 on the substrate 110 and bottom source/drain(s) 160.

In one or more embodiments, the sidewall liners 135 can be removed using a selective, isotropic etch (e.g., dry plasma etch) once the portions of the gap layer 170 have been removed. removal of the sidewall liners 135 can expose the region of the fin transition region 112 defined by the thickness of the sidewall liner 135, including position 115.

Figure 13:
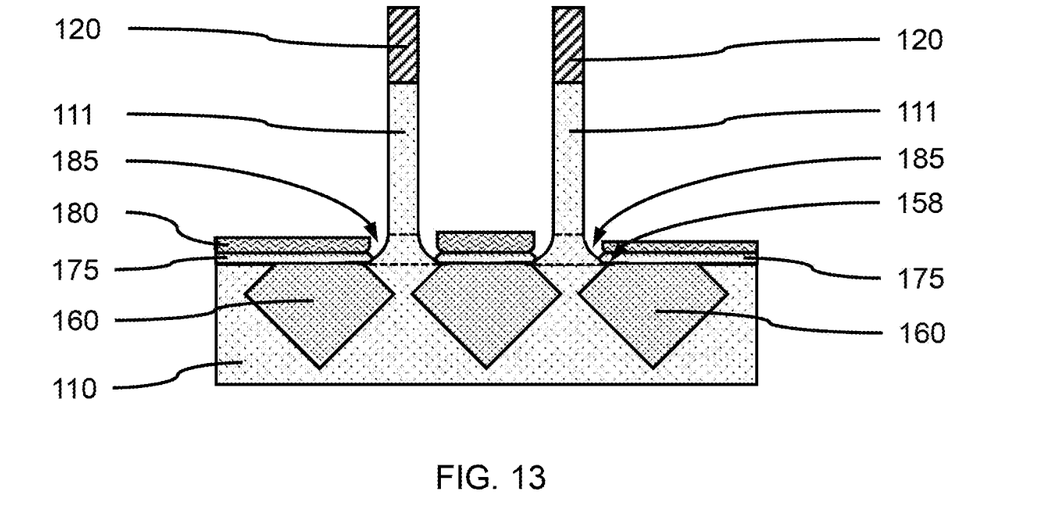
FIG. 13 is a cross-sectional side view showing portions of the gap layer segments between the bottom spacer layer and fin transition regions removed to expose the fin transition regions, in accordance with an embodiment of the present invention.

FIG. 13 is a cross-sectional side view showing portions of the gap layer segments between the bottom spacer layer and fin transition regions removed to expose the fin transition regions, in accordance with an embodiment of the present invention.

In one or more embodiments, portions of the gap layer segments 175 along an edge of the bottom spacer layer 180 proximal to a vertical fin 111 and between the bottom spacer layer and fin transition regions 112 can be removed, for example, by an isotropic etch, to further expose the surface of the fin transition region 112 and sidewalls of the bottom spacer layer 180. Removal of the sidewall liners 135 and portions of the gap layer segments 175 can form a spacer gap 185 between the bottom spacer layer 180 and the fin transition region 112 or sidewall of the vertical fin 111. The spacer gap 185 can have a width equal to the offset distance from the sidewall of the vertical fin 111. The remaining portion of the gap layer segment 175 can be adjacent to position 115, determined by the thickness of liner layer 130, and can cover a portion of fin transition region 112 between the edge 158 of the bottom source/drain 160 and the vertical fin 111. The location of the edges of the bottom spacer layer 180 and the gap layer segment 175 relative to the fin transition region 112 and bottom source/drains 160 can be controlled to determine the position of a gate junction, and maintain greater consistency and uniformity between VTFET devices. The distance between the edge of the bottom source/drain and the end of the gap layer segment 175 can be fixed. The use of gap layer segment 175 can avoid the formation of a meniscus without a predetermined spacer gap 185 from having only the bottom spacer layer 180. The combination of the bottom spacer layer 180 and the gap layer segment 175 can avoid very poor gate length variability and a high resistance in the bottom source/drain to gated region.

In various embodiments, the position of the edge of the gap layer segments 175 along the fin transition region 112 can be uniform on both sides of the vertical fin 111 and between different vertical fins to provide a uniform gate junction location for each VTFET device formed. Having the controlled position of the edge of the gap layer segment 175 can position the gate closer to the bottom source/drain epitaxial region than with a bottom spacer layer 180 alone, and can significantly reduce the meniscus effect (which can leave a long tail of residual material on the vertical fin) of the spacer dielectric on the vertical fin 111, and provide a sharper edge for gate control of the device channel.

Figure 14:
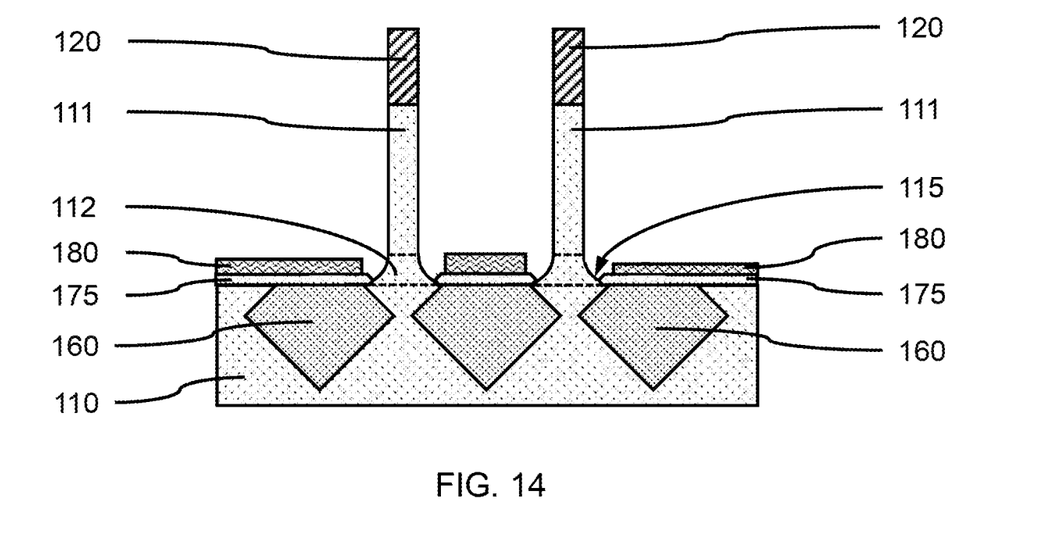
FIG. 14 is a cross-sectional side view showing sections of the bottom spacer layer removed, in accordance with an embodiment of the present invention.

FIG. 14 is a cross-sectional side view showing sections of the bottom spacer layer removed, in accordance with an embodiment of the present invention.

In one or more embodiments, sections of the bottom spacer layer 180 can be removed to crop the bottom spacer layer 180 and expose a larger area of the underlying gap layer segments 175. The sections of the bottom spacer layer 180 can be removed by masking a central portion of the bottom spacer layer 180 and selectively removing edge portions that are not covered by the mask using a selective etch (e.g., RIE, dry plasma etch). Trimming the bottom spacer layer 180 can provide space for the subsequent formation of both a gate dielectric layer and conductive gate layer within the spacer gap 185 extending between the bottom spacer layer 180 and vertical fin sidewall and/or fin transition region 112 depending on the curvature of the fin transition region 112 and the thicknesses of the bottom spacer layer and gap layer segment. The position of the bottom of the gate structure along the fin transition region 112 can thereby be precisely controlled.

In various embodiments, the bottom spacer layer 180 may not be further cropped.

In various embodiments, the width of the bottom spacer layer 180 can be less than the width of the underlying gap layer segment 175 between adjacent vertical fins 111. The width of the gap layer segment 175 can be greater than the width of the surface of an underlying bottom source/drain between adjacent vertical fins 111.

Figure 15:
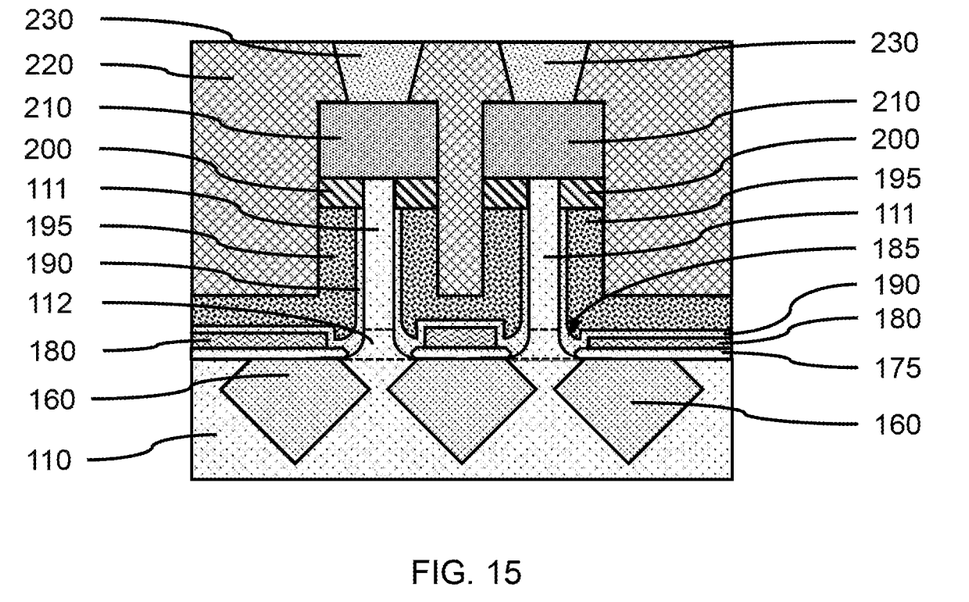
FIG. 15 is a cross-sectional side view showing a gate structure and top source/drain formed on each of the vertical fins and the bottom spacer layer, in accordance with an embodiment of the present invention.

FIG. 15 is a cross-sectional side view showing a gate structure and top source/drain formed on each of the vertical fins and the bottom spacer layer, in accordance with an embodiment of the present invention.

In one or more embodiments, a gate structure, including a gate dielectric layer 190 and a conductive gate layer 195 can be formed on the vertical fins 111 and in the spacer gap 185, where the gate junction can be uniformly aligned with the edge of the gap layer segments 175. The gate-to-source/drain capacitance can be reduced by the placement of the gap layer segments 175 on the bottom source/drain(s) 160 and the placement of the bottom spacer layer 180 on the gap layer segments 175.

In various embodiments, the gate dielectric layer 190 can be formed by a conformal deposition (e.g., ALD, PEALD). In various embodiments, the gate dielectric layer 190 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 190 can have a thickness in a range of about 1 nm to about 3 nm, or about 2 nm, although other thicknesses are also contemplated.

In various embodiments, the conductive gate layer 195 can be formed by a conformal deposition (e.g., ALD, PEALD), blanket deposition, or combination thereof. In various embodiments, the conductive gate layer 195 can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, or any suitable combination of these materials.

The gate dielectric layer 190 and conductive gate layer 195 can form an active gate structure on one or more vertical fin(s) 111 and fin transition region 112.

In one or more embodiments, a top spacer 200 can be formed on the gate structure(s) including a gate dielectric layer 190 and a conductive gate layer 195, where the top spacer 200 can be an electrically insulating dielectric material (e.g., silicon oxide (SiO). A top source/drain 210 can be formed on the vertical fin(s) 111, where the top source/drain 210 can be n-doped or p-doped to match the associated bottom source/drain(s) 160. The top source/drain 210 can be formed by epitaxial growth on an exposed surface of the vertical fin 111. An interlayer dielectric (ILD) layer 220 can be formed on the substrate 110 and gate structure, where the ILD layer 220 can be an electrically insulating dielectric material. A source/drain contact 230 can be formed in the ILD layer 220 to each of the top source/drains 210, where the source/drain contact 230 can be a conductive material.

Figure 16:
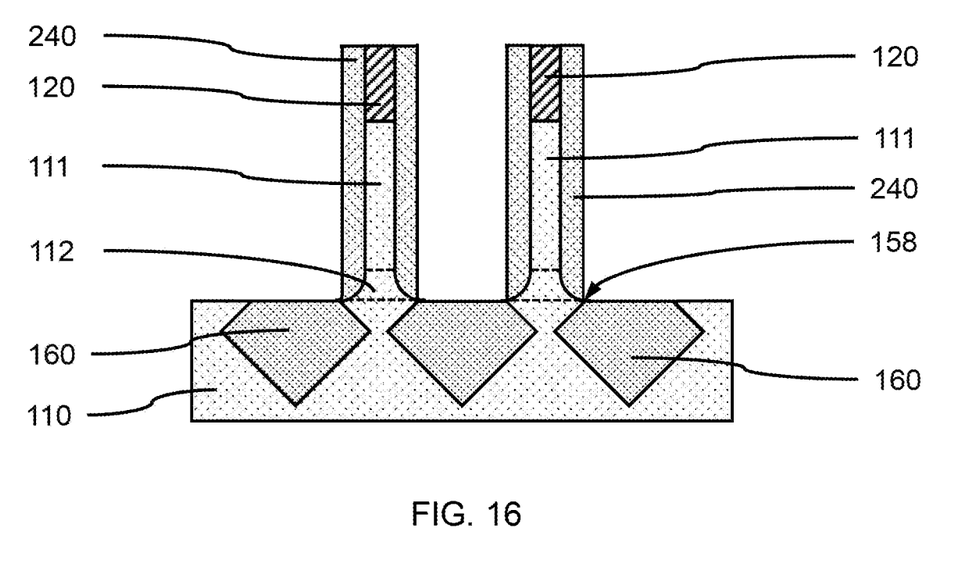
FIG. 16 is a cross-sectional side view showing sacrificial sidewall spacers formed on the vertical fins and fin templates, and bottom source/drains formed in the substrate adjacent to the sacrificial sidewall spacers, in accordance with another embodiment of the present invention.

FIG. 16 is a cross-sectional side view showing sacrificial sidewall spacers formed on the vertical fins and fin templates, and bottom source/drains formed in the substrate adjacent to the sacrificial sidewall spacers, in accordance with another embodiment of the present invention.

In one or more embodiments, sacrificial sidewall spacers 240 can be formed on the vertical fins 111, fin transition region 112, and fin templates 120, where the sacrificial sidewall spacers 240 can be formed by conformally depositing a sacrificial sidewall spacer layer and removing portions of the sacrificial sidewall spacer layer from horizontal surfaces parallel with the plane of the substrate 110 using a selective, directional etch (e.g., RIE).

In various embodiment, the sacrificial sidewall spacer layer and sacrificial sidewall spacers 240 can be a dielectric material, including, but not limited to, silicon oxide (SiO), silicon nitride (SiN), silicon boro carbonitride (SiBCN), and combinations thereof, where the sacrificial sidewall spacer layer and sacrificial sidewall spacers 240 can be selectively removed relative to other layers and materials present.

In various embodiments, the sacrificial sidewall spacer layer and sacrificial sidewall spacers 240 can have a thickness in a range of about 0.5 nanometers (nm) to about 10 nm, or about 2 nm to about 4 nm, although other thicknesses are also contemplated. The thickness of the sacrificial sidewall spacers 240 can determined the offset distance for the edge 158 of the trench and edge 158 of the bottom source/drain 160.

The sacrificial sidewall spacers 240 can mask a portion of the substrate 110 and/or fin transition region 112 adjacent to the vertical fins 111 to determine the position of subsequently formed bottom source/drains from a gate junction and vertical fins 111, where the edge 158 of a trench can define a precise position from the adjacent vertical fin 111 for a bottom source/drain 160.

Figure 17:
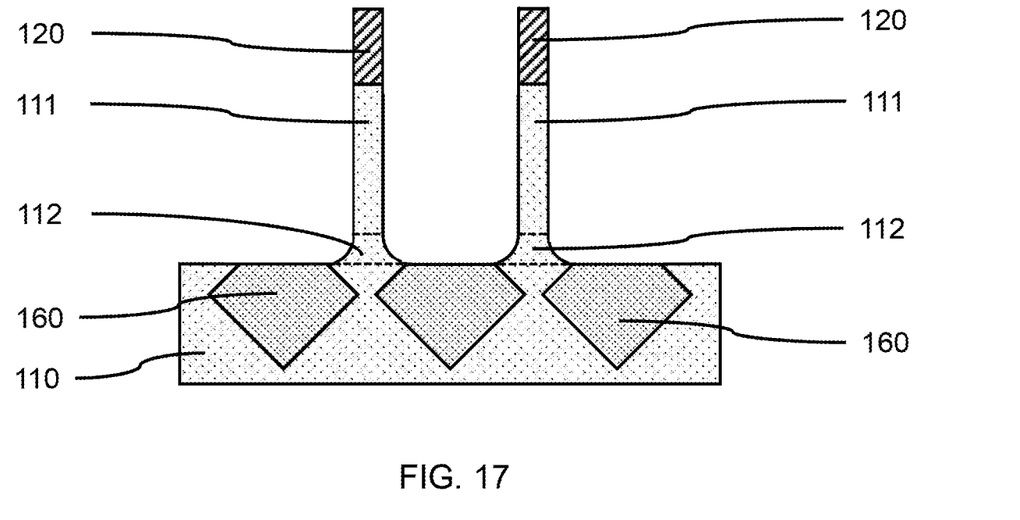
FIG. 17 is a cross-sectional side view showing removal of the sacrificial sidewall spacers from the fin transition regions, vertical fins, and fin templates, in accordance with another embodiment of the present invention.

FIG. 17 is a cross-sectional side view showing removal of the sacrificial sidewall spacers from the fin transition regions, vertical fins, and fin templates, in accordance with another embodiment of the present invention.

In one or more embodiments, the sacrificial sidewall spacers 245 can be removed to expose the sidewalls of the vertical fins 111 and fin transition region 112.

Figure 18:
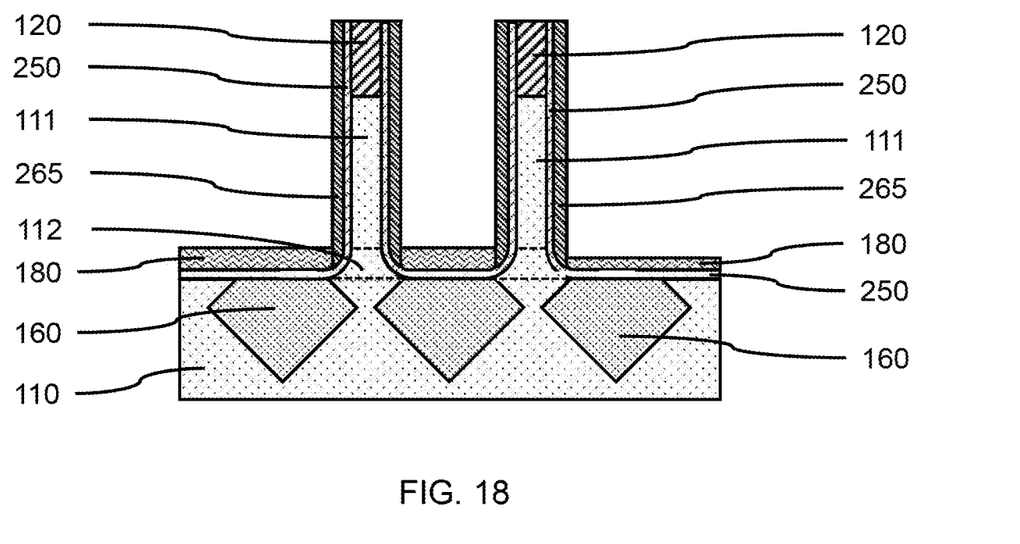
FIG. 18 is a cross-sectional side view showing a second liner layer and second sidewall spacers formed on the vertical fins, and a bottom spacer layer formed on the second liner layer, in accordance with another embodiment of the present invention.

FIG. 18 is a cross-sectional side view showing a second liner layer and second sidewall spacers formed on the vertical fins, and a bottom spacer layer formed on the second liner layer, in accordance with another embodiment of the present invention.

In one or more embodiments, a second liner layer 250 can be formed on the fin templates 120, vertical fins 111, fin transition region 112, and surface of the substrate 110. The second liner layer 250 can be formed by a conformal deposition, for example, atomic layer deposition (ALD), plasma enhanced ALD (PEALD), or a combination thereof.

In various embodiments, the second liner layer 250 can have a thickness in a range of about 1 nanometers (nm) to about 5 nm, or about 2 nm to about 4 nm, although other thicknesses are also contemplated. The thickness of the second liner layer 250 can have a tight tolerance using the conformal deposition to control an offset distance from the sidewalls of the vertical fin 111. The second liner layer 250 can sufficiently thick to protect the vertical fins 111 and fin transition regions 112 during subsequent processing.

In various embodiment, the second liner layer 250 can be a dielectric material, including, but not limited to, titanium oxide (TiO), silicon nitride (SiN), silicon oxide (SiO), and combinations thereof, where the liner layer 130 can be selectively removed relative to other layers and materials present.

In one or more embodiments, a second sidewall spacer layer can be formed on the second liner layer 250, where the second sidewall spacer layer can be formed by a conformal deposition, for example, atomic layer deposition (ALD), plasma enhanced ALD (PEALD), or a combination thereof. A portion of the second sidewall spacer layer can be removed using a selective, directional etch (e.g., RIE) to form second sidewall spacers 265 on the second liner layer 250.

In various embodiment, the second sidewall spacers 265 can be a dielectric material, including, but not limited to, titanium oxide (TiO), silicon nitride (SiN), silicon oxide (SiO), and combinations thereof, where the liner layer 130 can be selectively removed relative to other layers and materials present.

In one or more embodiments, a bottom spacer layer 180 can be formed on the second liner layer 250 over the substrate 110 and bottom source/drains 160. The bottom spacer layer 180 can be formed by a directional deposition, for example, a high density plasma (HDP) deposition, a gas cluster ion beam (GCIB) deposition, or a combination thereof. An etch-back using a selective directional etch (e.g., RIE) can be used to reduce the height of the bottom spacer layer 180.

In various embodiments, the bottom spacer layer 180 can have a thickness in a range of about 4 nm to about 8 nm with a variation in the thickness at different points of about 1 nm to about 5 nm. The thickness of the bottom spacer layer 180 can be different between different adjacent pairs of the vertical fins 111.

In various embodiment, the bottom spacer layer 180 can be a dielectric material, including, but not limited to, silicon oxide (SiO), silicon nitride (SiN), silicon boro carbonitride (SiBCN), and combinations thereof, where the bottom spacer layer 180 can be selectively removed relative to other layers and materials present.

Figure 19:
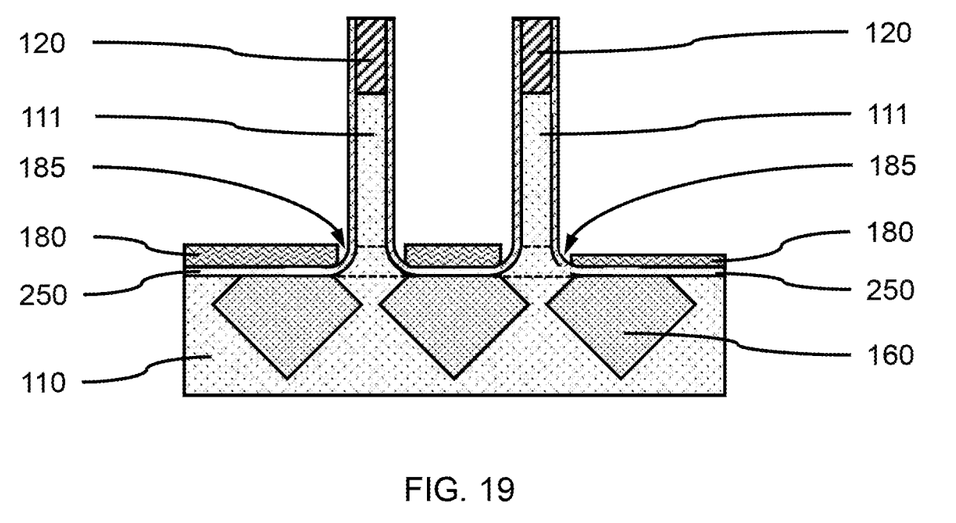
FIG. 19 is a cross-sectional side view showing the second sidewall spacers removed from the second liner layer, in accordance with another embodiment of the present invention.

FIG. 19 is a cross-sectional side view showing the second sidewall spacers removed from the second liner layer, in accordance with another embodiment of the present invention.

In one or more embodiments, the second sidewall spacers 265 can be removed from the second liner layer 250, where the second sidewall spacers 265 can be removed using a selective, isotropic etch (e.g., dry plasma etch) to form a spacer gap 185 between the bottom spacer layer 180 and the second liner layer 250.

Figure 20:
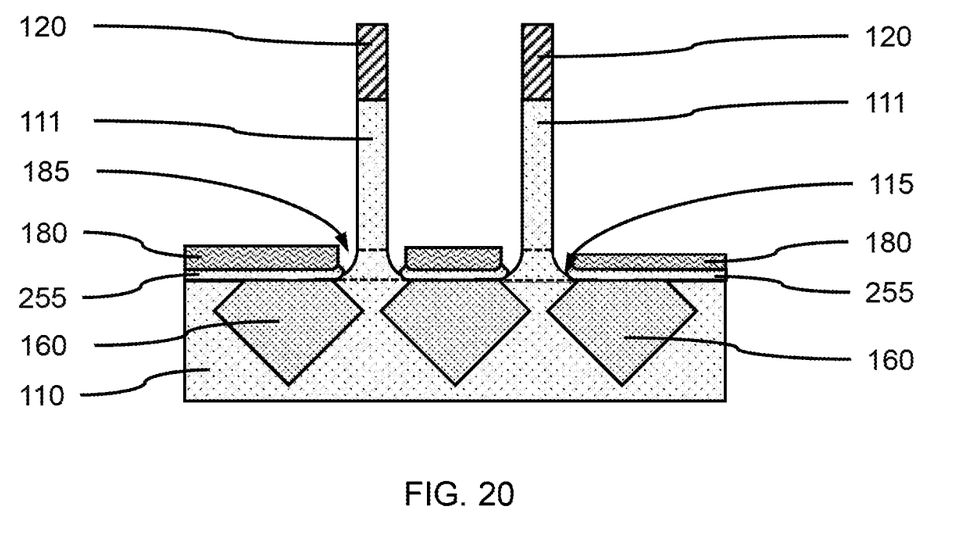
FIG. 20 is a cross-sectional side view showing exposed portions of the second liner layer removed from the vertical fins and fin templates, and the bottom spacer layer etched back, in accordance with another embodiment of the present invention.

FIG. 20 is a cross-sectional side view showing exposed portions of the second liner layer removed from the vertical fins and fin templates, and the bottom spacer layer etched back, in accordance with another embodiment of the present invention.

In various embodiments, the spacer gap 185 can be enlarged by removing the exposed portions of the second liner layer 250, where the second liner layer 250 can be removed using a selective, isotropic etch (e.g., dry plasma etch). Removal of the exposed portions of the second liner layer 250 can form second liner segments 255 on the substrate 110 below the bottom spacer layer 180. The edge of the remain portion of the second liner segments 255 can accurately define a position 115 for a subsequently formed gate junction.

In various embodiments, the fabrication of the VTFET device can continue as shown in FIGS. 14 and 15 with further cropping of the bottom spacer layer 180 and/or the formation of the gate structure and top source/drains.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and methods of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical transport field effect transistor (VTFET), comprising:
   a vertical fin on a substrate;
   a fin transition region between the vertical fin and the substrate, wherein the fin transition region has a curved surface;
   a gap layer segment on the substrate;
   a bottom spacer layer on the gap layer segment;
   a gate dielectric layer on a sidewall of the vertical fin, a top surface of the bottom spacer layer, at least a portion of the gap layer segment, and the fin transition region, wherein the gate dielectric layer separates the bottom spacer layer and an edge of the gap layer segment from the fin transition region; and
   a conductive gate layer on the gate dielectric layer.

2. The VTFET of claim 1, wherein the gate dielectric layer is a high-k dielectric material, and is directly on the sidewall of the vertical fin, the top surface of the bottom spacer layer, and at least the portion of the gap layer segment.

3. The VTFET of claim 1, wherein the edge of the gap layer segment is aligned with an edge of a bottom source/drain adjacent to the fin transition region.

4. The VTFET of claim 1, wherein the top surface of the bottom spacer layer on a gap layer segment on a first VTFET device is at a different height than the bottom spacer layer on a gap layer segment on a second VTFET device.

5. The VTFET of claim 1, wherein the bottom spacer layer is a high density plasma oxide and the gap layer segment is silicon nitride (SiN).

6. A vertical transport field effect transistor (VTFET), comprising:
   a vertical fin on a substrate;
   a fin transition region between the vertical fin and the substrate, wherein the fin transition region has a curved surface;
   a gap layer segment on the substrate adjacent to the fin transition region;
   a bottom spacer layer on the gap layer segment; and
   a gate structure on the bottom spacer layer and a side surface of the vertical fin, wherein the gate structure separates the bottom spacer layer from the fin transition region.

7. The VTFET of claim 6, further comprising a first bottom source/drain in the substrate below the gap layer segment.

8. The VTFET of claim 7, further comprising a top source/drain on the vertical fin.

9. The VTFET of claim 8, further comprising a second bottom source/drain in the substrate on an opposite side of the vertical fin from the first bottom source/drain, wherein the first bottom source/drain and second bottom source/drain form a narrow neck below the vertical fin.

10. The VTFET of claim 8, wherein a proximal edge of the first bottom source/drain is a distance in a range of about 0 nm to about 5 nm from the vertical fin.

11. The VTFET of claim 8, wherein the bottom spacer layer is a different dielectric material from the gap layer segment.

12. The VTFET of claim 11, wherein the bottom spacer layer is silicon oxide and the gap layer segment is silicon nitride.

* * * * *